United States Patent [19]

Schroeder

[11] Patent Number: 5,758,037

[45] Date of Patent: May 26, 1998

[54] PRINT CONTROLLER WITH SIMPLIFIED VIDEO DATA PROCESSING

[75] Inventor: Dale W. Schroeder, Scotts Valley, Calif.

[73] Assignee: Hewlett-Packard Company, Palo Alto, Calif.

[21] Appl. No.: 700,157

[22] Filed: Aug. 20, 1996

Related U.S. Application Data

[63] Continuation of Ser. No. 329,115, Oct. 25, 1994, abandoned.

[51] Int. Cl.$^6$ .................................................... G11C 7/00
[52] U.S. Cl. ................................. 395/106; 395/114
[58] Field of Search ............................. 395/106, 114, 395/115, 101, 110, 111, 116, 163, 112

[56] References Cited

U.S. PATENT DOCUMENTS

| | | | |
|---|---|---|---|
| 4,797,746 | 1/1989 | Ashcraft | 358/140 |
| 4,985,848 | 1/1991 | Pfeiffer et al. | 364/518 |
| 5,166,786 | 11/1992 | Sakai et al. | 358/474 |
| 5,227,783 | 7/1993 | Shaw et al. | 340/870 |
| 5,263,135 | 11/1993 | Dei | 395/163 |
| 5,270,973 | 12/1993 | Guillemaud et al. | 395/106 |
| 5,293,593 | 3/1994 | Hodge et al. | 395/400 |
| 5,349,647 | 9/1994 | Freiburg et al. | 395/115 |
| 5,420,635 | 5/1995 | Konishi et al. | 348/362 |
| 5,436,734 | 7/1995 | Yamauchi et al. | 358/448 |
| 5,487,146 | 1/1996 | Guttag et al. | 395/166 |
| 5,493,646 | 2/1996 | Guttag et al. | 395/164 |
| 5,524,265 | 6/1996 | Balmer et al. | 395/800 |
| 5,594,473 | 1/1997 | Miner et al. | 345/199 |

*Primary Examiner*—Raymond J. Bayerl
*Assistant Examiner*—Steven P. Sax

[57] ABSTRACT

A print controller with simplified video data storage operation. A single microprocessor provides a controller with a start address and a start command. The controller monitors a stream of digitized video data as it fills a two part serial register in a video random access memory ("VRAM"). As each successive part of the serial register is filled, the controller writes the contents of the filled part of the serial register to the VRAM. Upon receipt of a signal indicating the end of the image, digitized video data remaining in the register is written to the VRAM. Images are effectively streamed in, as opposed to the line by line storage of images used in known print controllers.

6 Claims, 3 Drawing Sheets

PRINT CONTROLLER WITH SIMPLIFIED VIDEO DATA PROCESSING

CROSS REFERENCE TO RELATED APPLICATION

This is a continuation of application Ser. No. 08/329,115 filed on Oct. 25, 1994, now abandoned.

BACKGROUND OF THE INVENTION

This invention relates to printing using a stored digital image. More particularly, the present invention relates to the storage of a digitized video image that can then be transmitted to a printer.

Print controllers which accept video data as input and which convert the video data into a series of digitized images which can be transmitted to a laser or similar printer are known. The video capture circuitry of a known print controller is shown in FIG. 1.

Video data flows into digitizer 101 of print controller 100 on video input bus 102. The video data is converted into one of several known formats. These can include luminance-first color difference-second color difference("YUV") or red-green-blue("RGB") formats. This digitized color information is transmitted over data bus 104. Although bus 104 is shown as 8-bits wide, bus 104 could be any width without changing controller 100's operation significantly. Similarly, the format of the digitized video data is not a critical factor in controller 100's operation.

Digitizer 101 also provides a clock signal to Video Random Access Memory("VRAM") controller 107 over clock signal line 106 and horizontal and vertical synchronization ("HSynch" and "VSynch", respectively) signals over HSynch line 108 and VSynch line 110 to first microprocessor 103. The clock signal allows VRAM controller 107 to count the number of pixels whose digitized color information has been sent to VRAM 111. The HSynch signal allows first microprocessor 103 to determine the end of each line of digitized video data and the VSynch signal allows first microprocessor 103 to determine the end of each digitized video image.

First microprocessor 103 is coupled to both VRAM controller 107 and main microprocessor 105.

Print controller 100 stores digitized video data in VRAM 111 using a line by line computationally intensive process. As digitized video data flows into VRAM 111 over bus 104, VRAM controller 107 counts the number of pixels of digitized video data that has flowed into VRAM 111's serial input register. When either a preset number of pixels'information is in the register or an HSynch signal is sent to first microprocessor 103, first microprocessor 103 commands VRAM controller 107 to move whatever is in VRAM 111's serial input register into the VRAM. A new starting address for the next line of digitized video data is generated by first microprocessor 103 and loaded into VRAM controller 107.

First microprocessor 103 is kept fully occupied managing the line by line storage of digitized video data in VRAM 111. Main microprocessor 105 is needed to manage all other image related tasks. These can include image manipulation such as enlarging or editing and overall memory allocation.

This known architecture and its operation have several deficiencies. The process is computationally intensive, requiring two separate microprocessors, the first to accommodate the line by line storage of the digitized video data and the second to perform all other tasks related to video storage processing. If the length of a single horizontal line of digitized video data is shorter than the width of the VRAM serial input register, a great deal of VRAM memory can be wasted by loading the individual lines into VRAM 111.

This known system also lacks flexibility. Many different sizes and formats of digitized video data exist. Each different image size and format requires reprogramming of both microprocessors. This can be handled by a table of different line lengths, but memory size still must be reconfigured for each data format.

SUMMARY OF THE DISCLOSURE

A first embodiment of the present invention comprises a print controller which can accept many formats of digitized video images in almost any resolution in either color or monochrome. The print controller's digitizer produces a programmable number of pixels for a programmable number of lines. The print controller accepts the incoming pixels without concern for the number of pixels generated per line or how many lines are digitized. The VRAM has a two part serial register. A microprocessor in the print controller provides a starting address and a starting command to the VRAM controller. At the beginning of a video image, indicated by a VSynch pulse, the VRAM controller watches for a changing flag signal. Each time the flag signal changes state, the VRAM controller transfers video data from one half of the serial register into the VRAM. Every second time the flag signal changes state, the VRAM controller increments the starting address. At the next VSynch pulse, the VRAM controller transfers the remaining data in the serial input register into the VRAM.

This embodiment of the present invention is computationally simpler than the known art, as individual lines of video data are not clocked into the VRAM under microprocessor control. Any video format or image size can be used. Memory utilization is also much improved.

The present invention will now be described in detail, with reference to the figures listed and described below.

BRIEF DESCRIPTION OF THE ILLUSTRATIONS

DETAILED DESCRIPTION OF THE PREFERRED EMBODIMENT

Figure 1:
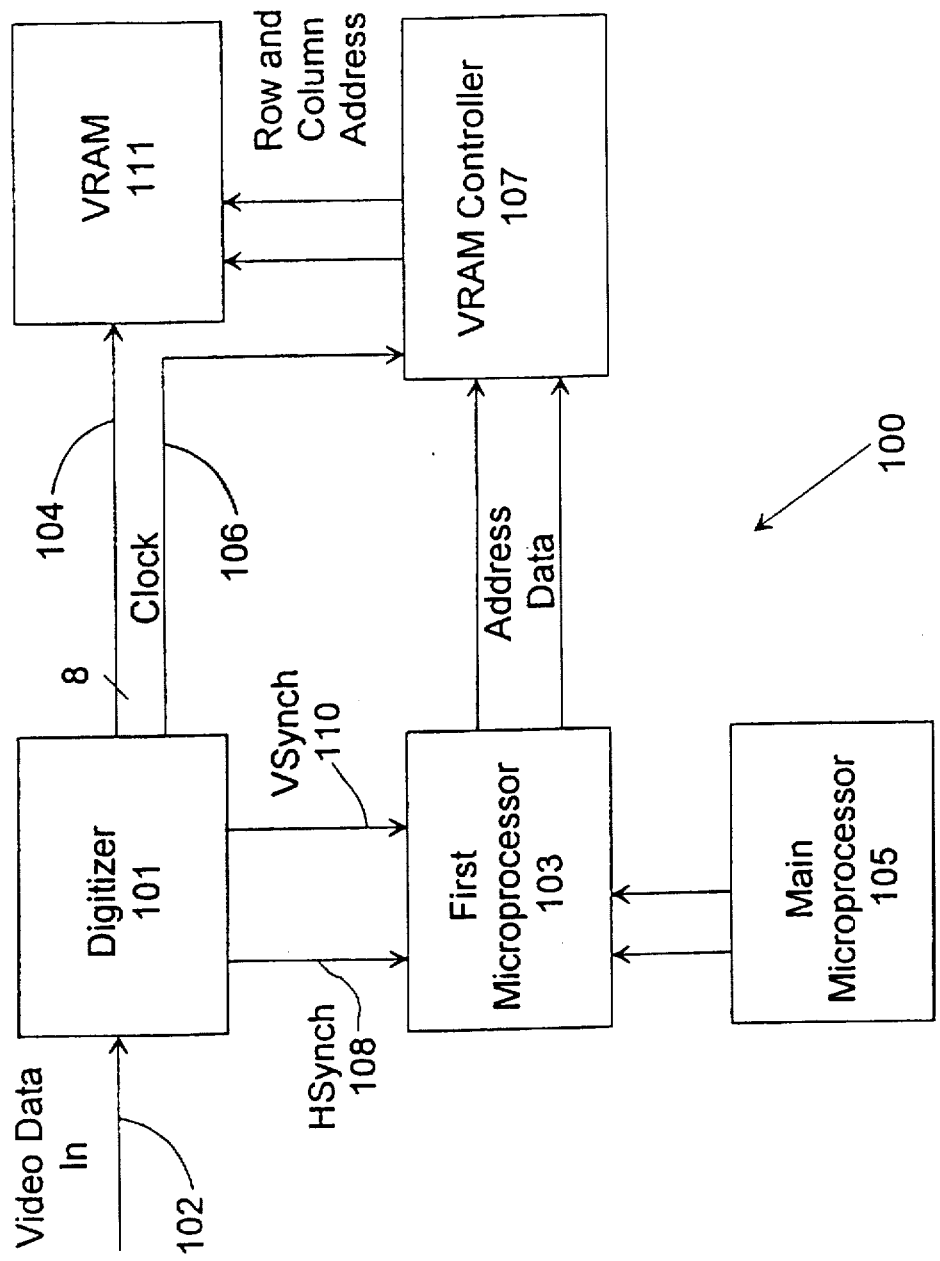
FIG. 1 is a block diagram of a known print controller (Prior Art)
Figure 2:
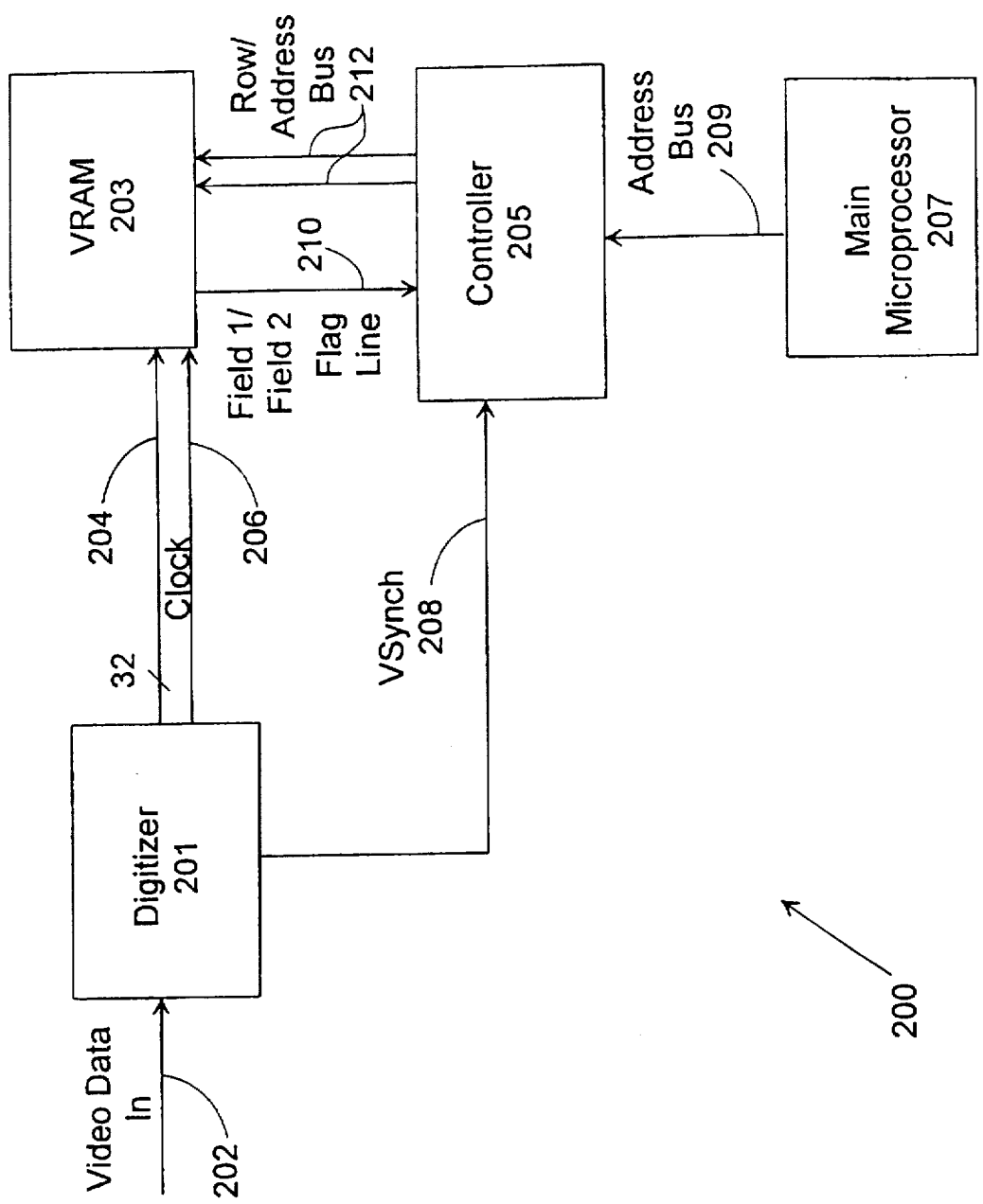
FIG. 2 is a block diagram of the first embodiment of the present invention.

FIG. 2 is a block diagram of the first embodiment of the present invention. Print controller 200 is comprised of a digitizer 201 which accepts video data on video input bus 202, digitizes it, and transmits it to VRAM 203 on data bus 204. Digitizer 201 also generates a clock signal and a VSynch signal which are respectively transmitted over clock signal line 206 and VSynch line 208. Digitizer 201 is a commercially available Phillips SAA 7194 and requires no further description herein.

VRAM 203 receives the digitized video image and stores it initially in a two part register. Clock signal line 206 is also coupled to VRAM 203. VRAM 203 generates an Field 1/Field 2 flag signal which is transmitted to controller 205 over Field 1/ field 2 flag line 210 and indicates which part of the serial register is being loaded. VRAM 203 is also coupled to controller 205 by means of a row/address bus 212. In this embodiment, VRAM 203 is a commercially available Micron 42C8256DJ and requires no further description herein.

Controller 205 is coupled to main microprocessor 207 by an address/data bus 209 and to digitizer 201 by a VSynch signal line 208. Controller 205 is realized in this embodiment by means of a custom designed field programmable gate array produced by Xilinx and main microprocessor 207 comprises a Motorola 68030.

Figure 3:
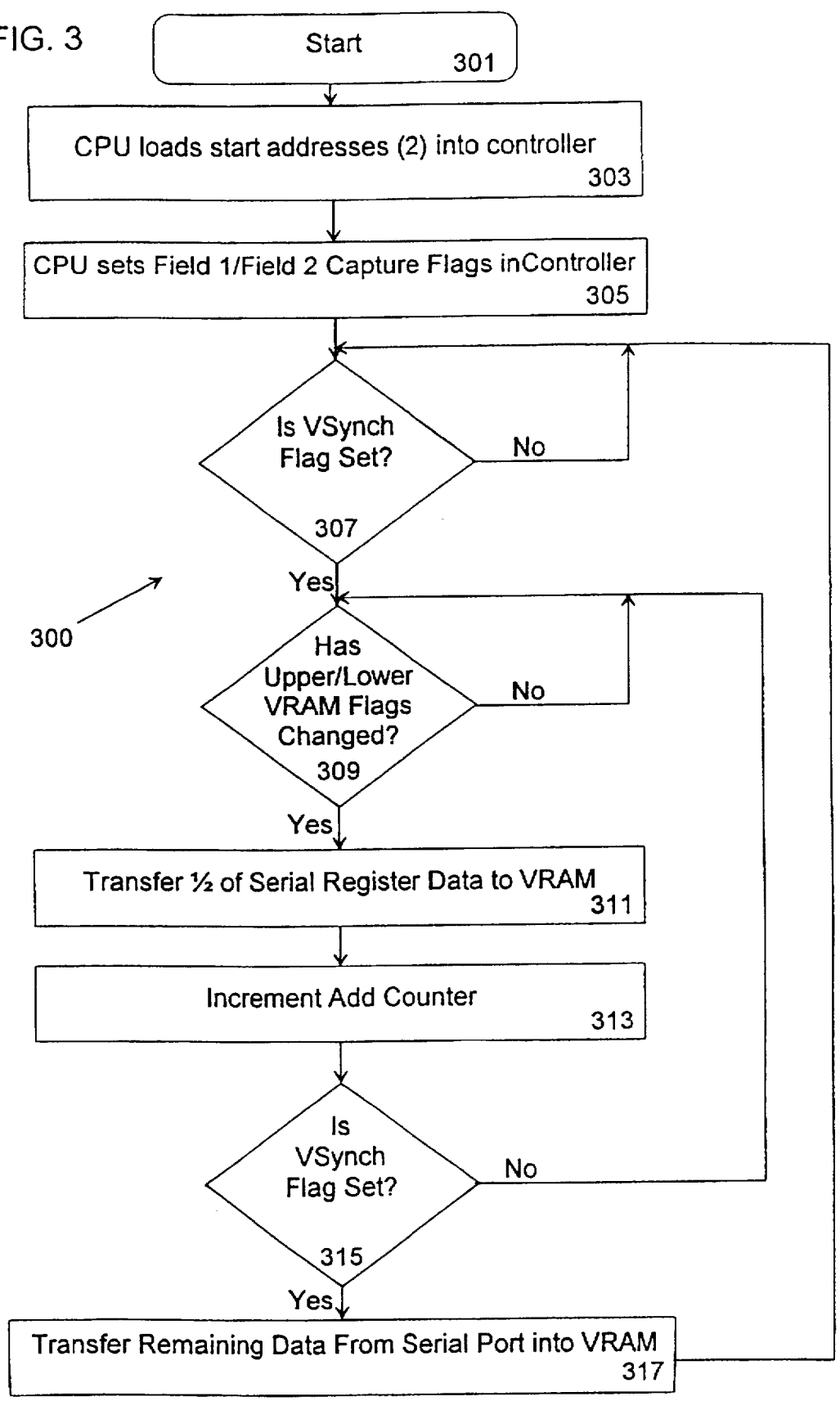
FIG. 3 is a flow chart showing the operation of the first embodiment.

The operation of print controller 200 is illustrated by flow chart 300 in FIG. 3. After starting at step 301, main microprocessor 207 loads a starting address into controller 205 at step 303, sets Field 1/Field 2 capture flags in controller 205 at step 305, and provides a start command to controller 200. Print controller 200 then waits at step 307 until a VSynch flag is set, indicating the beginning of a new digitized image. Once the VSynch flag is set, digitized video is streamed into VRAM 203's two part serial register. At step 309, print controller 200 tests to see if the Field 1/Field 2 flag has changed. Until the flag changes, operation remains at step 309. Once the flag changes, the system transfers one half of the data in the serial register(the contents of either Field 1 or Field 2) of VRAM 203 into the VRAM at step 311 and an add counter is incremented at step 313. If the absence of a VSynch signal is detected at step 315, indicating that all the digital video data for the present image has not been received, control returns to step 309. If a VSynch signal indicates that the image is complete, then, at step 317, the remaining data in the VRAM's serial port is transferred to the VRAM and control returns to step 307. Operation continues until a stop command is received from main microprocessor 207.

In this manner, the transfer of video data from the digitizer to the VRAM proceeds in one continuous stream for the entire image. This contrasts strongly with the known art, wherein the video image's data is stored on a line by line basis. The processing involved in the present invention is also much simpler than in the known art, as microprocessor 207 needs to provide only a start address and a start command, a state machine in controller 205 performing the remaining processing tasks. This contrasts with the continual generation of line addresses by at least one microprocessor in the known art. Also, as each half of the serial register is filled completely before writing to the VRAM, memory allocation is much more efficient.

More digitized video data could be stored at any one time by using several VRAMs arranged in a parallel architecture. The control circuitry and method described herein would still be used, as all the serial registers in the parallel VRAMs would fill at the same rate, and the Field 1/Field 2 flag in only the first VRAM could serve to trigger the transfer of video data from one half of each of the respective serial registers simultaneously into the respective VRAMs.

What is claimed:

1. A print controller for converting and storing analog video data from at least a first image, the print controller comprising:

a digitizer for accepting analog video data from the at least first image and converting it into digital video data of the at least first image, the digitizer also generating a clock signal and a vertical synchronization signal;

a video random access memory which receives the digital video data and clock signal from the digitizer, the video random access memory having at least a first two part serial register coupled to the digitizer for accepting the digital video data of the at least first image and storing it successively and alternatingly in the first and second part of the first two part serial register;

a controller coupled to the digitizer and the video random access memory, the controller receiving the vertical synchronization signal from the digitizer and utilizing it to provide for ordering the digital video image data to be written to the video random access memory from the first and second parts of the two part serial register as the first and second parts of the serial register are filled alternatingly and successively; and a processor coupled to the controller for generating only a first starting address for the digital video data of the at least first image and a start command for the controller, the controller ordering the video random access memory to begin storage of the digital video image in data in the two part serial register, dependant upon receipt of the vertical synchronization signal, at the starting address generated by the processor.

2. The print controller of claim 1 wherein a plurality of video random access memories are coupled to the digitizer, the controller ordering the writing of digital video data of the first image to all the video random access memories when the first and second parts of the serial register in the first video random access memory are filled successively.

3. A method for storing digitized video data from at least a first image, the method comprising the steps of:

generating a clock signal and a vertical synchronization signal from a digitizer;

flowing, as dependant upon receipt of the clock signal, the digitized video data of the at least first image into a first serial register;

setting a first flag when the first serial register is full;

writing, as dependant upon receipt of the vertical synchronization signal, the digitized video data of the at least first image in the first serial register into a first memory;

flowing, as dependant upon receipt of the clock signal, the digitized video data of the at least first image into a second serial register when the first flag is set;

resetting the first flag when the second serial register is full;

writing, as dependant upon receipt of the vertical synchronization signal, the digitized video of the at least first image data in the second serial register to the first memory;

repeating the steps until all the video data of the at least first image has been stored in the first memory and generating only a first starting address and a start command, and using the start command to begin storage of the digital video data in the first and second serial registers, at the first starting address, dependant upon receipt of the vertical synchronization signal.

4. A print controller for converting and storing analog video data from a succession of individual images comprising:

a digitizer for receiving analog video data from each of the images successively and converting them successively to digitized video data, the digitizer generating a clock signal and a vertical synchronization signal for each successive image;

a serial-to-parallel two part register coupled to the digitizer for receiving the digitized video data and storing it successively in the first and second part of the register;

a memory coupled to the register, the memory accepting digitized video data in parallel and successively from the first and second part of the register;

logic means coupled to the digitizer, the register, and the memory for detecting the start of the digitized data by using the vertical synchronization signal from each successive image, for detecting when the first and second parts of the register are filled, and for commanding the writing of the digitized video data from the first and second registers into the memory; and a processor coupled to the logic means for providing a start command and only a first a starting address for each successive image for the logic means, the logic means ordering the memory to begin storage, upon receipt of the vertical synchronization signal, of the contents of the first and second parts of the register at the first starting address received from the processor.

5. The print controller of claim 4 wherein the serial-to-parallel register and the memory comprise a single video random access memory.

6. The print controller of claim 5 wherein a plurality of video random access memories with a plurality of serial-to-parallel two part registers are coupled to the digitizer, the logic means being coupled to only one of the video random access memories, the logic means detecting only when the first and second parts of the serial-to-parallel registers of the first of the plurality of video random access memories are filled before ordering all the memories to begin storage of the contents of the registers in the remaining plurality of video random access memories.

* * * * *